United States Patent [19]
Wang et al.

[11] Patent Number: 5,331,669
[45] Date of Patent: Jul. 19, 1994

[54] ASYNCHRONOUS PULSE CONVERTER

[75] Inventors: James H. Wang; Julia W. Wang, both of Mission Viejo, Calif.

[73] Assignee: Ologic Corporation, Costa Mesa, Calif.

[21] Appl. No.: 879,953

[22] Filed: May 6, 1992

[51] Int. Cl.⁵ .................. H04L 7/00; H04L 25/36; H04L 25/40; H03K 5/13
[52] U.S. Cl. .................. 375/118; 307/269; 328/63; 328/72
[58] Field of Search .................. 375/106, 110, 118; 307/269; 328/63, 72, 74, 109, 110; 370/91

[56] References Cited

U.S. PATENT DOCUMENTS

| | | | |
|---|---|---|---|
| 4,851,710 | 7/1989 | Grivna | 328/63 |
| 4,926,445 | 5/1990 | Robb | 375/110 |
| 4,935,942 | 6/1990 | Hwang et al. | |
| 4,973,860 | 11/1990 | Ludwig | 307/269 |
| 5,012,127 | 4/1991 | Gates et al. | 307/269 |
| 5,155,745 | 10/1992 | Sugawara et al. | 307/269 |

*Primary Examiner*—Stephen Chin
*Assistant Examiner*—Duane Kobayashi
*Attorney, Agent, or Firm*—Spensley Horn Jubas & Lubitz

[57] ABSTRACT

An improved pulse converter for converting a stream of asynchronous input pulses of undetermined duration into a stream of synchronous output pulses of standard duration. The input pulses may occur in any phase or frequency relationship to the reference with the limitation that the input pulses must not occur more frequently than one period of a reference clock plus one synchronizer input hold time and one synchronizer setup time. Additionally, the input pulses must be at least as wide as required to set an input flip-flop. The inventive asynchronous pulse converter requires only two flip-flops, a synchronizer, and a single Exclusive-OR gate, and a single reference clock.

8 Claims, 6 Drawing Sheets

ASYNCHRONOUS PULSE CONVERTER

BACKGROUND OF THE INVENTION

1. Field of the Invention

This invention relates to an electronic circuit, and more particularly to an electronic circuit for converting asynchronous pulses into synchronous pulses.

2. Description of Related Art

Digital data processing devices and digital communications equipment, to mention only a few examples, often must receive asynchronous digital information. Generally, the receiving device must clock or strobe the asynchronous information into an input register. This information generally is a series of high voltage states and low voltage states (i.e., logical "1" and logical "0" states). The duration of each logical "1" state and each logical "0" state is typically unknown. Therefore, a problem exists in determining when transitions occur in the incoming data stream. Incoming data generally cannot be interpreted if the transitions from logical "1" state to logical "0" state and back again cannot be accurately determined.

In one common scheme for receiving asynchronous digital data, an internal clock that has a much greater frequency than the incoming data stream is used to "sample" the incoming data stream. On each rising edge of the internal clock, the data is clocked into an input register. Since the clock frequency is relatively high with respect to the incoming data, there is no chance that data will transition from one state to another before two sequentially rising edges of the internal clock occur.

Two limitations exist in such a system. First, under the limits of the Nyquist criterion, the frequency of such an internal clock must be at least twice the incoming signal frequency. Second, an incoming signal must not have a pulse width (either logical "1" state or logical "0" state) that is less than one full cycle of the internal clock.

Figure 1:
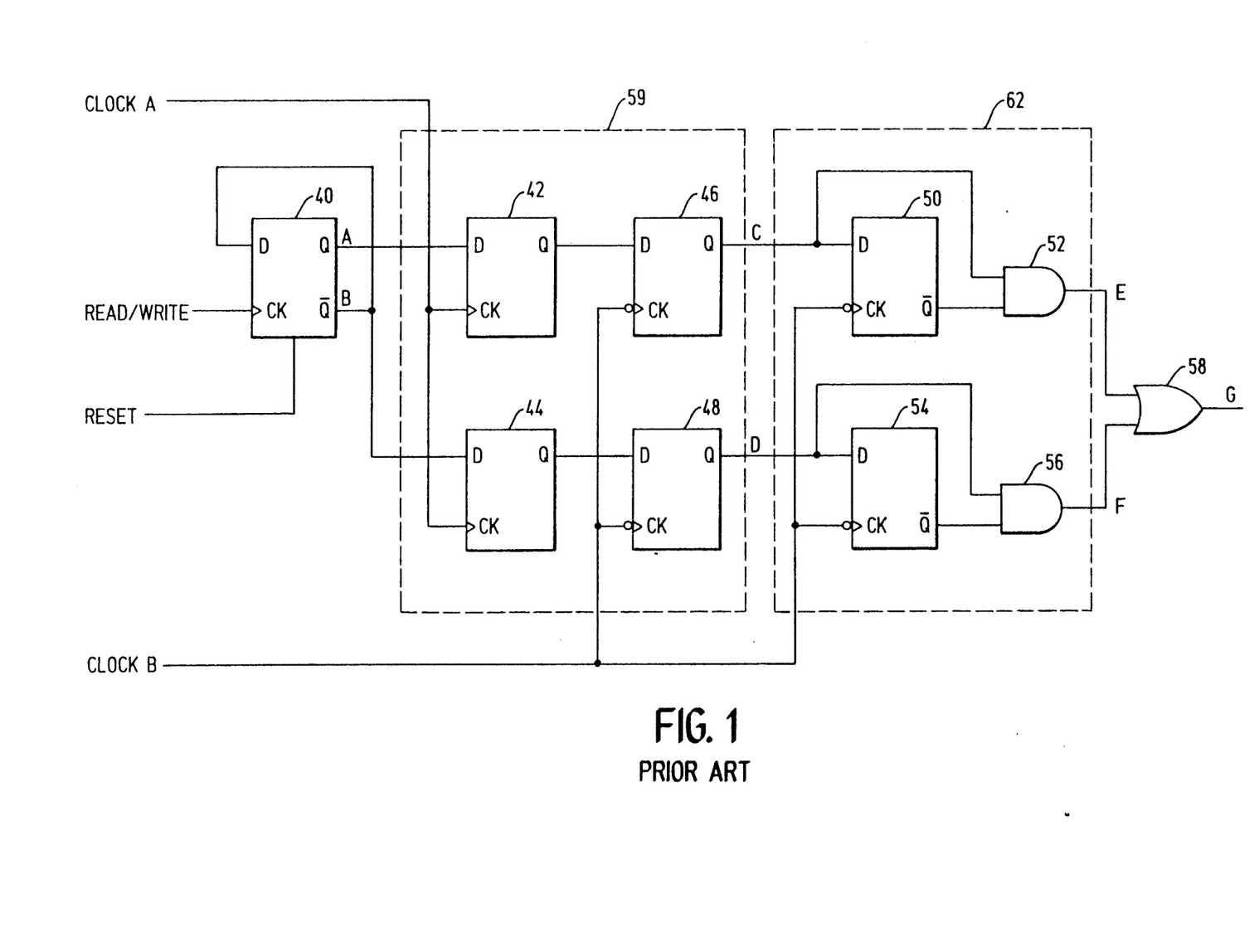
FIG. 1 is a simplified schematic of a prior art pulse synchronizer.

These limitations have been overcome in part by a data sampling architecture disclosed in U.S. Pat. No. 4,935,942 to Hwang et al. FIG. 1 shows the Hwang pulse synchronizer. The input signal RD/WR is coupled to the clock input of a first standard D-type rising edge triggered flip-flop 40. Four other flip-flops 42, 44, 46, 48 are coupled to the output of the first flip-flop 40 as a synchronizer 59, which synchronizes the incoming signal to two internal clocks A, B. Two additional flip-flops 50, 54 coupled to two AND gates 52, 56 and an OR gate 58 shape the output of the flip-flops 46, 48. The synchronizer may be reset only by a reset input at the first flip-flop 40. The input signal can have a frequency up to about 90% of the frequency of the internal clock A, B.

A continuing goal of integrated circuit designers is to place more functions on a single substrate. Because area on a substrate is limited, it is important to reduce the number of devices that are used for any particular function. Additionally, the less components used, the higher the reliability of the entire system due to a reduction in the number of points of failure. While the Hwang circuit is effective, it is complex and requires at least two synchronized internal clocks. In addition, extraneous pulses can be generated by noise that triggers the flip-flops of the synchronizer 60. Pulses can also be created upon initial introduction of power to the synchronizer 60. Pulses can also be created upon initial introduction of power to the synchronizer, depending upon how the flip-flops that comprise the synchronizer are initially resolved.

Therefore, it is desirable to synchronize and shape incoming asynchronous data pulses with a less complex (fewer components) and less expensive circuit that requires only one internal clock having a frequency which is only slightly greater than the frequency of the input signal, and in which each flip-flop can be reset independently to guaranty that additional pulses never occur.

SUMMARY OF THE INVENTION

The present invention is an improved asynchronous pulse converter for converting a stream of asynchronous input pulses of undetermined duration into a stream of synchronous output pulses of standard duration. The input pulses may occur in any phase or frequency relationship to a reference clock with the limitation that the input pulses must not occur more frequently than one period of the reference plus the hold time and the setup time of the first stage of the synchronizer section. Additionally, the input pulses must be at least as wide as required to clock (set) an input flip-flop. The inventive asynchronous pulse converter requires only two flip-flops, a synchronizer, a single Exclusive-OR gate, and a single reference clock.

The present invention receives asynchronous input pulses at the clock input to a standard D-type rising edge triggered flip-flop. The input flip-flop is configured to operate in a toggle mode (i.e., the inverted output is coupled to the D-input). Therefore, each time the input pulse transitions from a logic "0" state to a logic "1" state, the output of the flip-flop will change states. The noninverting output of the D-type flip-flop is coupled to the signal input of a single-stage synchronizer section. The synchronizer includes a standard D-type rising edge triggered flip-flop coupled to a pulse shaper section including another standard D-type rising edge triggered flip-flop. The noninverting output of the synchronizer section and the noninverting output of the pulse shaper section are coupled to a difference detector that indicates when the logic level at the output of the synchronizer section has changed from either a low logic level to a high logic level, or visa verse, after a transition of the clock from a high to a low logic level. By so doing, the difference detector serves as a dual-edge detector, indicating that a transition from high to low or from low to high at the output of the synchronizer has occurred (i.e., the logic level at the last occurrence of the rising edge of the clock is different from the logic level at the next clock rising edge).

The result is a data stream of pulses at the output of the difference detector. Each pulse is of a determined duration, synchronized to the reference clock, and corresponds to a asynchronous input pulse of unknown duration, provided the input pulses do not occur at intervals less than one period of the reference clock plus one hold time and one setup time of the first stage of the synchronizer section being used.

The details of the preferred embodiment of the present invention are set forth in the accompanying drawings and the description below. Once the details of the invention are known, numerous additional innovations and changes will become obvious to one skilled in the art.

BRIEF DESCRIPTION OF THE DRAWINGS

Like reference numbers and designations in the various drawings refer to like elements.

DETAILED DESCRIPTION OF THE INVENTION

Throughout this description, the preferred embodiment and examples shown should be considered as exemplars, rather than as limitations on the present invention.

Figure 2:
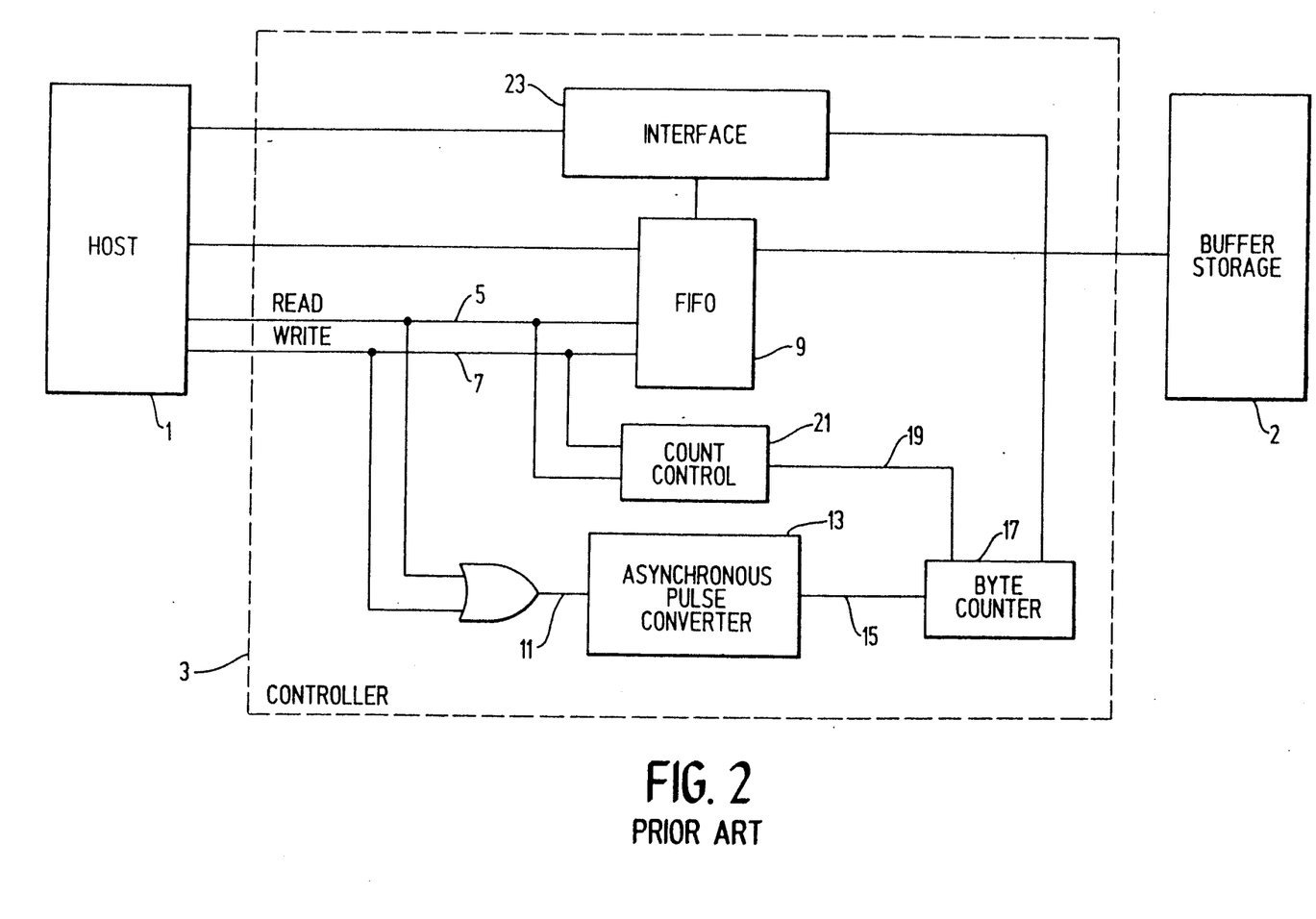
FIG. 2 is a simplified schematic diagram of a prior art data processing system in which an asynchronous pulse converter is used.

The present invention can be used in numerous applications. One such application is as a synchronizing pulse converter for a peripheral controller circuit. Such a peripheral controller transmits data between a host computer and a buffer storage memory. FIG. 2 illustrates such a peripheral controller. Data is either sent from a host 1 to buffer storage 2 or from buffer storage 2 to the host 1. The host 1 is coupled to a controller 3. The controller 3 is coupled to the buffer storage 2.

A read signal 5 is sent from the host 1 to the controller 3 when data is to be transmitted from the buffer storage 2 to the host 1. A Write signal 7 is sent when data is to be transferred from the host 1 to the buffer storage 2. Data to be transferred is buffered in a "first-in first-out" (FIFO) buffer 9. The number of bytes of data in the FIFO 9 must be known at all times to ensure that the data does not overrun the FIFO 9 and that no attempt is made to read the FIFO 9 in the absence of valid data (underrun).

For this purpose, a Read/Write signal 11 is created by Oring the Read and Write signals 5, 7 that are sent to the controller 3 from the host 1. The Read/Write signal 11 is synchronized to a clock (not shown) internal to the controller 3 by the present invention 13. For the example application shown in FIG. 2, the synchronized signal 15 causes a byte counter 17 to either increment or decrement depending upon a control signal 19 received by the byte counter 17 from a count control module 21. By counting the number of bytes that are received into the FIFO 9, the controller 3 can be assured of not overrunning or underrunning the FIFO 9. The byte counter 17 sends the byte count to an interface 23 that communicates with the host 1 and controls the FIFO 9.

Figure 3:
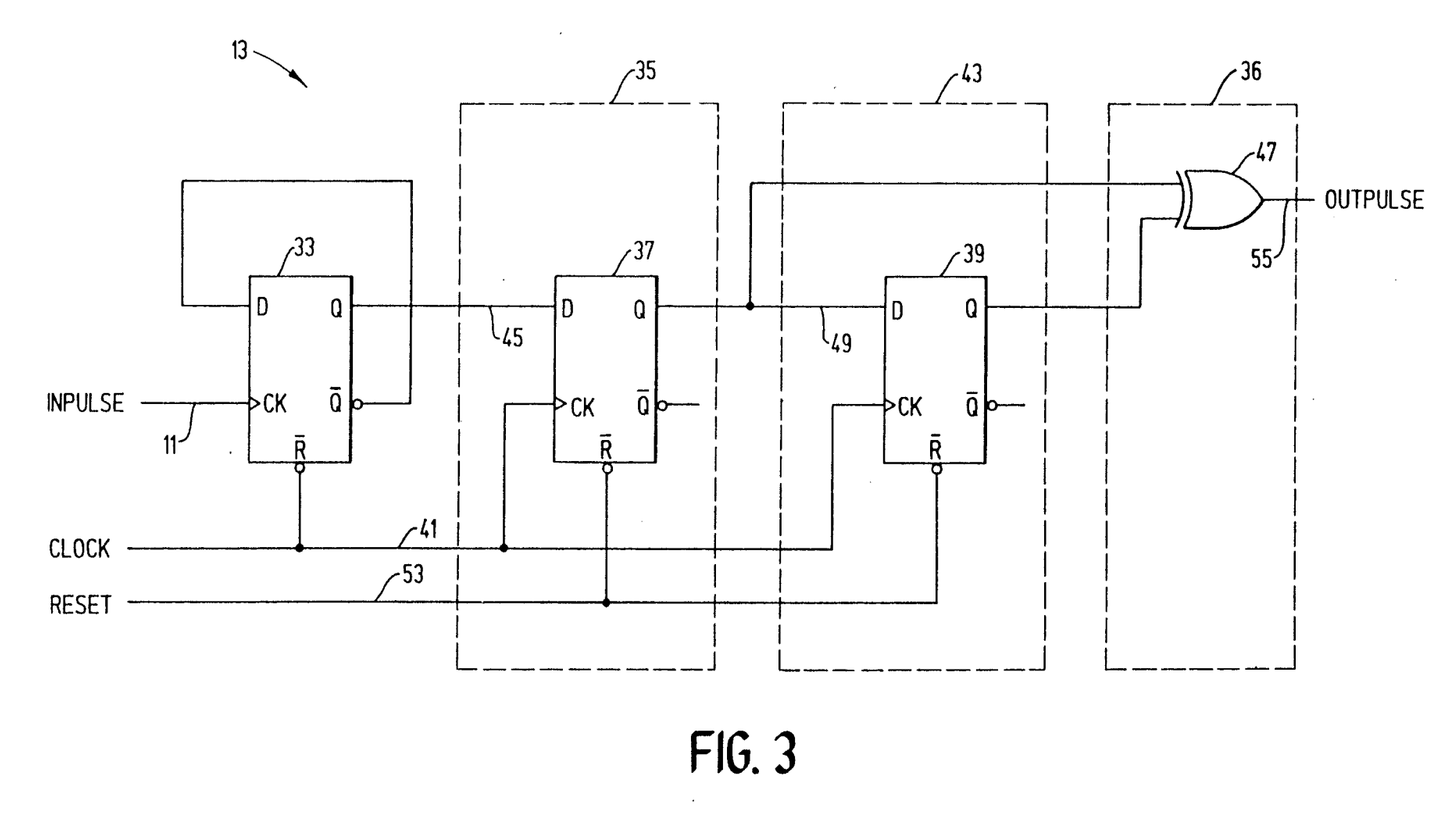
FIG. 3 is a simplified schematic of the preferred embodiment of the inventive asynchronous pulse converter.
Figure 4:
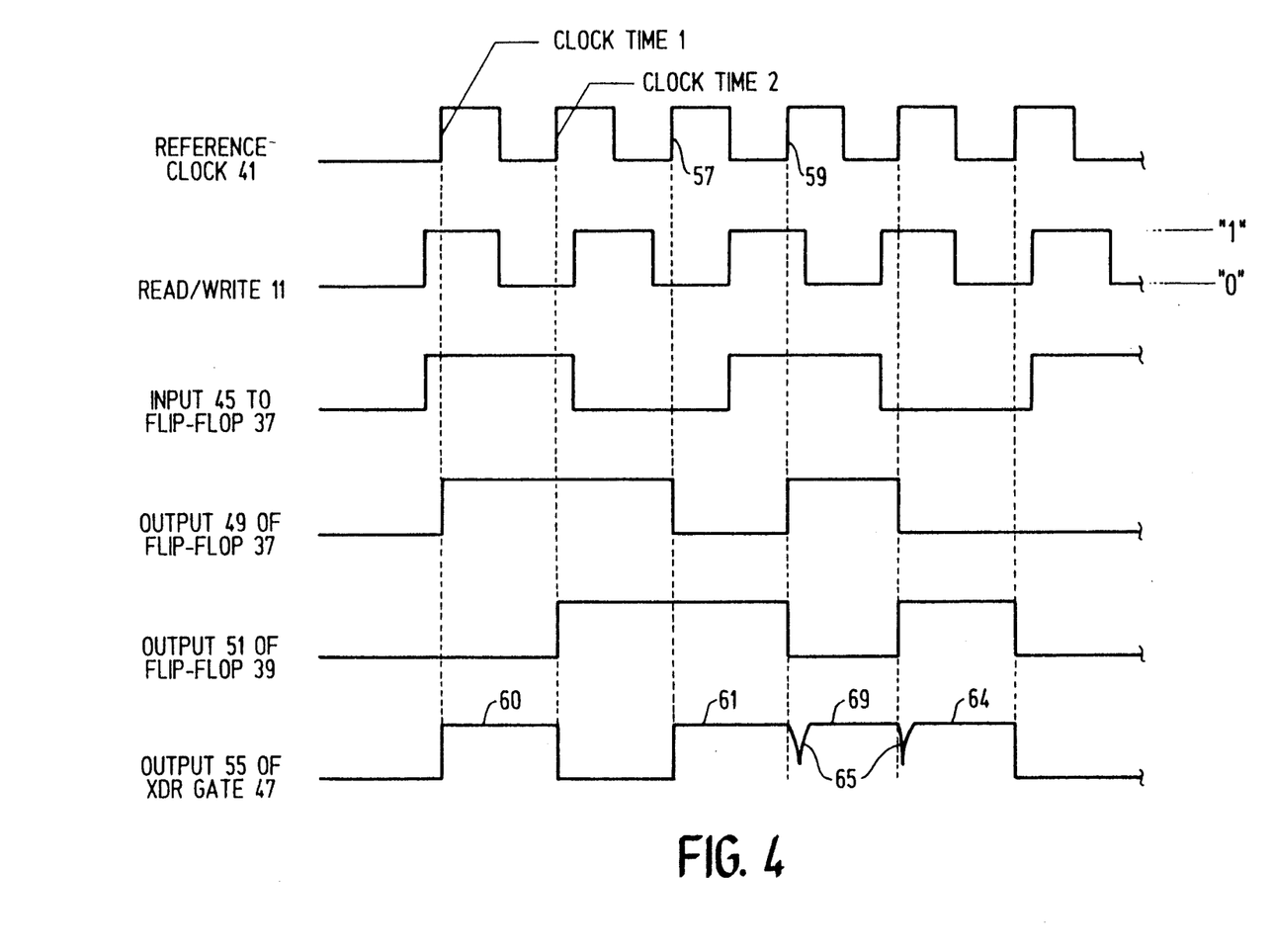
FIG. 4 is a timing diagram of the significant signals internal and external to the inventive pulse converter.

A simplified schematic of the preferred embodiment of the present invention is shown in FIG. 3. FIG. 4 is a timing diagram of the inventive circuit 13. The asynchronous digital Read/Write signal 11 is applied to an input detection section of the inventive pulse converter 13. In the preferred embodiment of the invention, the input detection section is an edge triggered latching device, such as a D-type rising edge triggered flip-flop 33. The inverting output of the input flip-flop 33 is coupled to the signal input of the flip-flop 33 to create a toggle circuit. The output of the toggle circuit changes state whenever the Read/Write signal 11 at the input to the flip-flop 33 transitions from a logical "1" state to a logical "0" state, or vise versa. See the Read/Write signal line 11 in the timing diagram of FIG. 4. (For the purpose of this description all logic is assumed to be positive, i.e., a logical "1" is assumed to be a relative high voltage state, and a logical "0" is assumed to be a relative low voltage state). It should be understood by those skilled in the art that the input detection section could, alternatively, be a negative edge triggered latching device, such as a D-type falling edge triggered flip-flop.

The noninverting output Q of the input flip-flop 33 is coupled to the input of a single-stage synchronizer section 35 which, in the preferred embodiment, includes at least one latching device, such as D-type rising edge triggered flip-flop 37. A pulse shaper section 43 is coupled to the output Q of the flip-flop 37 within the synchronizer section 35. In the preferred embodiment, the pulse shaper section 43 is a D-type flip-flop 39. The clock inputs of the D-type flip-flops 37, 39 of the synchronizer section 35 and the pulse shaper section 43 are coupled to a single reference clock signal 41. The outputs Q of the flip-flops 37, 39 are coupled to a difference detection section 36, such as an Exclusive-Or gate 47.

Figure 5:
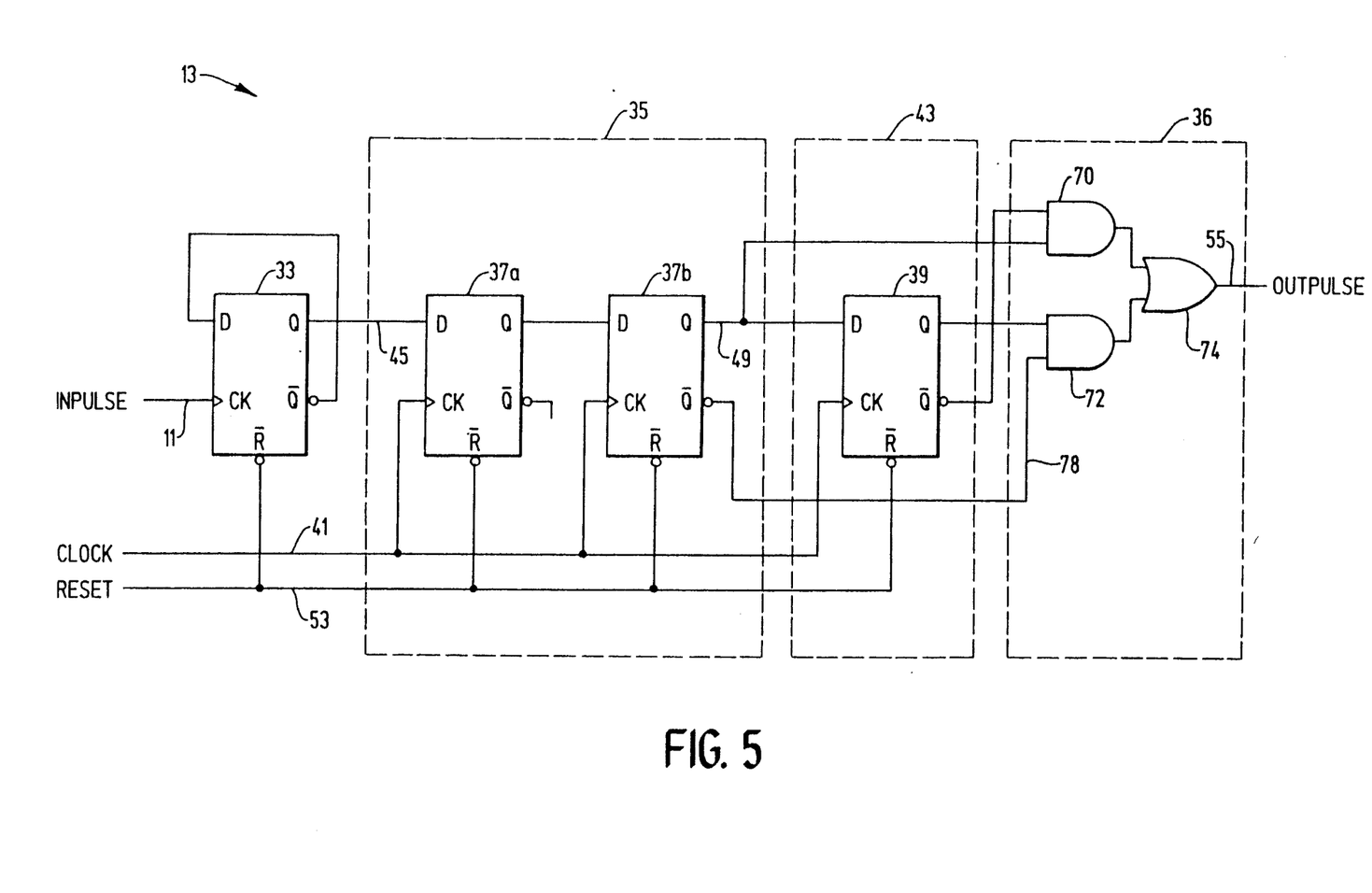
FIG. 5 is a simplified schematic of an alternative embodiment of the inventive asynchronous pulse converter having a two-stage synchronizer section.

In an alternative embodiment, as shown in FIG. 5, the difference detector 36 includes two AND gates 70, 72, and an OR gate 74. The noninverting output Q of the final stage of the synchronizer 37b is coupled to a first input of a first AND gate 70. The inverting output $\overline{Q}$ of the pulse shaper flip-flop 39 is coupled to a second input of the first AND gate 70. Therefore, when the final stage 37b of the synchronizer 35 is set and the pulse shaper flip-flop 39 is not set, the output of the first AND gate 70 will be a logic "1" state. The noninverting output Q of the pulse shaper flip-flop 39 is coupled to a first input of the second AND gate 72. The inverting output $\overline{Q}$ of the final stage 37b of the synchronizer 35 is coupled to second input to the second AND gate 72. Therefore, when the final stage 37b of the synchronizer 35 is not set and the pulse shaper flip-flop 39 is set, the output of the second AND gate will be a logic "1" state. The outputs of the two AND gates 70, 72 are coupled to the inputs to the OR gate 74. Therefore, if either one of the flip-flops 37b, 39 is set and the other is not set, the output of the OR gate will be a logic "1" state.

A condition required for the inventive pulse converter to operate properly is that the duration between input pulses be at least equal to one cycle of the reference clock 41 plus one hold time and one setup time of the input flip-flop of the synchronizer section 35. Hence, the output 45 of the input flip-flop 33 will remain in each logical state at least until the next rising edge of the reference clock 41 occurs. (Note that the input pulse may be very narrow, as long as the minimum clock width of the input flip-flop is not violated). In the preferred embodiment of the present invention, when the next rising edge of the reference clock 41 occurs, the logic level of the D-input 45 of the flip-flop 37 of the synchronizer section 35 will be latched into the flip-flop 37. Therefore, the output 49 of the synchronizer flip-flop 37 will assume the logical state that was present at the input of the flip-flop 37 at the time the rising edge the clock 41 occurred. The output 49 of the first stage 37 is coupled to the input of the pulse shaper flip-flop 39.

The logic level of the signal 49 at the output of the flip-flop 37 at a time just after a first rising edge of the reference clock 41 is defined as the logic level at clock time 1 (see FIG. 4). The logic level of the signal 49 at the input to the pulse shaper flip-flop 39 after a second (next) rising edge of the reference clock 41 is defined as the logic level at clock time 2. The logic level of the signal 51 at the output of the pulse shaper flip-flop 39 at clock time 2 will equal the previous logic level at clock time 1. Whenever the logic level at clock time 1 differs from the logic level at clock time 2, the output of the difference detection section 36 will be a logic "1" at clock time 2, and a synchronized output pulse 60 will be created. This relationship holds generally for comparisons of logic levels at clock time N and clock time N+1.

Referring to FIG. 4, the leading edges of the output pulses 60, 61, 63, 64 are created by a change in state of the output 49 of the flip-flop 37. Because the pulse shaper flip-flop 39 is one clock pulse "behind" flip-flop 37, each time the output 49 of the flip-flop 37 changes state, the output 51 of the pulse shaper flip-flop 39 will have the previous logic level. This will cause the two outputs 49, 51 to be different, thereby causing the difference detector 36 to output a logical "1".

The trailing edge of each synchronized pulse is defined by clocking the logic level present at the input to the pulse shaper flip-flop 39 through to the output of the pulse shaper flip-flop 39. At clock time 2, the output 51 of the pulse shaper flip-flop 39 transitions from a logic "0" to a logic "1", making the outputs 49, 51 of both stages 37, 39 of the synchronizer section 35 equal. Therefore, the output 55 of the difference detection section 36 will be a logic "0".

When the input 49 to the pulse shaper flip-flop 39 changes state on two consecutive rising edges 57, 59 of the reference clock 41, two consecutive synchronized pulses 61, 63 will be created at the output 55 of the difference detection section 36. Whenever two consecutive pulses are created, the output 55 of the difference detection section 36 may not clearly define the end of one pulse and the beginning of another, and "glitches" 65 may appear in the signal 55 just after the second change of input 49 to the pulse shaper flip-flop 39 upon consecutive rising edges. However, the output 55 of the difference detection section 36 will be synchronized to the clock 41 such that the logic level 55 of the difference detection section 36 will be stable at each rising edge of the clock 41. Data need only be stable during the rising edge of the reference clock 41. These glitches 65 will only occur after the rising edge of the reference clock 41 has past. Therefore, due to the synchronous nature of the system, such glitches 65 will have no ill effect. It will be understood by those skilled in the art of synchronous systems, that a synchronous system is immune to glitches that occur at times when the data is known to be unstable.

Each of the flip-flops 33, 37, 39 of the preferred embodiment can be independently reset. The reset inputs to each flip-flop 33, 37, 39 are coupled to a single reset signal 53, thereby allowing the circuit to be held in a reset condition and preventing any possible extraneous pulses from being created at the output 55. In an other embodiment, the reset inputs to each flip-flop may be independently operated by reset signals that correspond to the flip-flop.

In an alternative embodiment illustrated in FIG. 5, the synchronizer section 35 of the pulse converter 13 includes at least two latches (such as D-type flip-flops). The noninverting output of the first of these flip-flops 37a is directly coupled to the signal input of the second flip-flop 37b. By coupling the output of the first flip-flop 37a of the synchronizer exclusively to the input of the second stage 37b, the possibility that the first stage 37a will cause an unsynchronized transistion at the output of the synchronizer section 35 due to the occurrence of a metastable state is reduced. Those skilled in the art of synchronizers will understand that latching circuits such as flip-flops require the input to remain stable for a predetermined minimum time before the transition of the clock that latches that input. Additionally, the input must remain stable for a minimum time after the clock stabilizes. These requirements are respectively called the "setup time" and "hold time" of the latch. When the setup time or hold time of a latch is violated, the latch may enter a metastable state in which the output of the latch may change without any change at either the signal input or the clock input. When a latch enters such a metastable state, noise and other internal perturbations will usually cause the latch to return to a stable state. The amount of time this takes varies. If returning from a metastable state to a stable state takes more than a specified amount of time, a "failure⇌ is said to have occurred. One way to characterize the performance of a synchronizing circuit is to measure the mean time between such failures. A higher mean time between failure (MTBF) is more desirable.

In the single-stage design shown in FIG. 3, the chances are that if the synchronizer 37a enters a metastable state, it will return to a stable state before the next clock time occurs. However, the undetermined state that would result is coupled directly to the difference detector 36 and could cause a nonsynchronous event to occur. Use of an additional stage 37b in the synchronizer section 35, as shown in the alternative embodiment of FIG. 5, provides the first stage 37a with time to return to a stable condition before the next rising edge of the clock, thereby buffering the difference detector 36 from the asynchronous event. This significantly increases the MTBF of the synchronizer.

Figure 6:
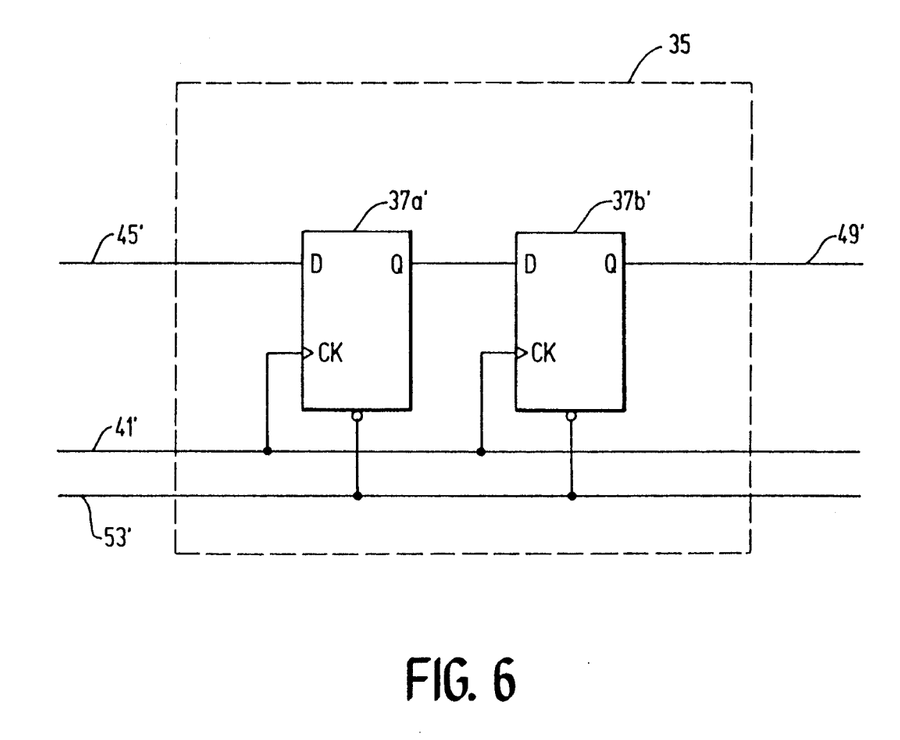
FIG. 6 is a simplified schematic of an alternative embodiment of the present invention having a two-stage synchronizer section in which one stage triggers on the positive edge of the clock and the other triggers on the negative edge of the clock.

In another alternative embodiment, the synchronizer 37 may be implemented by two latching devices 37a', 37b' as shown in FIG. 6. The first latching device 37a' is a negative edge triggered latching device, such as a negative edge triggered flip-flop. The second latching device 37b' is a positive edge triggered device, such as a positive edge triggered flip-flop. Reset inputs are coupled to the reset signal 53' to impose known states at the output of each of the stages 37a', 37b' of the synchronizer 37. The Q output 49' of the second stage 37b' of the synchronizer section 35 is coupled to the D input of the pulse shaper flip-flop 39. The D input to the first stage 37a' of the synchronizer section 35 is coupled to the Q output 45 of input flip-flop 33.

If the first latching device 37a' enters a metastable state, the first latching device 37a' has one half clock period to return to a stable condition before the next rising edge of the clock. Therefore, the second latching device 37b' buffers the difference detector 36 from the asynchronous event. The positive edge of the difference detector 36 output pulse is delayed by only one half the period of the clock 41' with respect to the Read/Write signal line 11 transition from a high to a low logic level. The occurrence of the negative edge of the output of the difference detector 36 is not delayed with respect to the circuit of the preferred embodiment. By use of a synchronizer in which the first and second stages are clocked on opposite edges of the clock pulse, the latency between the input and output is reduced.

It should be noted that in each of the embodiments of the present invention described above, the input frequency is only limited by the input restrictions of the first stage of the synchronizer section and the frequency of the reference clock. The maximum input frequency can be calculated as $FREQ_{IN} = 1/(T_{hold} + T_{setup} + (1/FREQ_{CLOCK}))$, where; $FREQ_{IN}$=the input frequency, $T_{hold}$=the hold time of the first stage latch of the synchronizer section, $T_{setup}$=the setup time of the first stage latch of the synchronizer section, and $FREQ_{CLOCK}$=the frequency of the reference clock. Therefore, where a clock frequency of 40 MHz is used, the setup time of the first stage of the synchronizer is 1.4 ns, and the hold time of the first stage of the synchronizer is 0.153 ns, the maximum input frequency will be 1/(1.4 ns + 0.1513 ns + 1/40 MHz) = 37.7 MHz. This is 94.25% of the clock frequency.

Accordingly, the inventive asynchronous pulse converter converts asynchronous pulses of undetermined widths into synchronous pulses of predetermined widths and requires only three latching circuits and one difference detecting circuit. Also, only one reference clock is required. Further improvements in the MTBF can be attained by including an additional latching circuit to the synchronizer section 35. The inventive pulse converter can convert pulses that have a period equal to one cycle of a reference clock plus one hold time and one setup time of the first stage of the synchronizer. Thus, the minimum pulse width is a function of the response characteristics of the synchronizer input.

A number of embodiments of the present invention have been described. Nevertheless, it will be understood that various modifications may be made without departing from the spirit and scope of the invention. For example, the inventive circuit could be practiced using negative logic. Also, the inventive circuit could be practiced with negative edge triggered flip-flops to synchronize negative pulses to a reference clock. Accordingly, it is to be understood that the invention is not to be limited by the specific illustrated embodiment, but only by the scope of the appended claims.

We claim:

1. An electronic pulse converter circuit for converting a sequence of asynchronous pulses of indefinite duration into a sequence of synchronous pulses of predetermined duration having a leading edge and a trailing edge, including:
   a. input detection means, having an input coupled to the sequence of asynchronous pulses, for detecting when an asynchronous input pulse to the input detection means transitions from a relatively low voltage state to a relatively high voltage state, or vice versa, and having an output indicative of the transition;
   b. synchronization means, coupled to the output of the input detection means, for generating first and second output signals indicative of a beginning time and an ending time of a synchronous pulse corresponding to an asynchronous input pulse, the synchronization means including:
      (1) first latching means, having an output, an input coupled to the output of the input detection means, and an input coupled to a reference clock, for outputting a first signal synchronized with a first leading edge of the reference clock and in response to a transition indication from the input detection means;
      (2) second latching means, having an output, a signal input coupled to the output of the first latching means, and a clock input coupled to the reference clock, for outputting a second signal synchronized with a second leading edge of the reference clock and in response to the output of the first latching means;
   c. difference detection means, having an output, a first input coupled to the output of the first latching means, and a second input coupled to the output of the second latching means, for outputting a pulse synchronous with the reference clock if a difference exists between the logic level of the first and second inputs to the difference detection means.

2. The asynchronous pulse converter circuit of claim 1, wherein the latching means are D-type flip-flops.

3. The asynchronous pulse converter circuit of claim 1, wherein the input detection means is a D-type flip-flop configured to cause the output of the D-type flip-flop to change logic states each time the clock input to the D-type flip-flop changes from a relatively low voltage state to a relatively high voltage state, and vice-versa.

4. The asynchronous pulse converter circuit of claim 1, wherein the difference detecting means is an Exclusive-OR gate.

5. The asynchronous pulse converter circuit of claim 1, wherein each latching means has an inverting output and a noninverting output, and the difference detecting means includes:
   a. a first AND gate having at least one output and two inputs, one input being coupled to the noninverting output of the first latching means and the other input being coupled to the inverting output of the seconding latching means; and
   b. a second AND gate having at least one output and two inputs, one input being coupled to the inverting output of the first latching means and the other input being coupled to the noninverting output of the second latching means; and
   c. an OR gate having at least one output and two inputs, one input being coupled to the output of the first AND gate and the other input being coupled to the output of the second AND gate.

6. The asynchronous pulse converter circuit of claim 1, wherein the input detection means, the first latching means, and the second latching means each have a reset means having a reset input coupled to a reset signal, for resetting each latching means to a selected state without regard for the logic level of the input signals to the input detection means, the first latching means, and the second latching means.

7. A computer system including:
   (a) a host computer;
   (b) a data storage device;
   (c) a data controller circuit for interfacing the host computer with the data storage device including:
      (1) a first-in/first-out memory coupled to the data storage device and the host computer for temporarily storing data;

(2) an interface circuit coupled to the host computer and the first-in/first-out memory for controlling the operation of the first-in/first-out memory; and
(3) an asynchronous pulse converter coupled to the host computer and the interface circuit, including:
   a) an input flip-flop coupled to the host computer for receiving an asynchronous pulse stream from the host computer and determining a transitional edge of each asynchronous pulse of the asynchronous pulse stream;
   b) a synchronization circuit, comprising at least one synchronization flip-flop coupled to the input flip-flop and a clock input signal, for synchronizing the determined transitional edge of each pulse of the asynchronous pulse stream to the clock input signal;
   c) a clock pulse generator coupled to the synchronization circuit, and the interface circuit, for detecting each transition of the synchronization circuit, creating an output pulse with a duration equal to one cycle of the clock input signal in response to each detected transition of the synchronization circuit, and transmitting the output pulse to the interface circuit.

8. The computer system of claim 7, wherein the data storage device is one of a magnetic disk drive, magnetic tape drive, or optical disk drive.

* * * * *

UNITED STATES PATENT AND TRADEMARK OFFICE
CERTIFICATE OF CORRECTION

PATENT NO. :  5,331,669
DATED      :  July 19, 1994
INVENTOR(S):  James H. Wang; Julia W. Wang It is certified that error appears in the above-indentified patent and that said Letters Patent is hereby corrected as shown below:

Title page, item [73],

Change "Ologic" to --QLogic--.

Signed and Sealed this

Twenty-seventh Day of September, 1994

Attest:

BRUCE LEHMAN

Attesting Officer          Commissioner of Patents and Trademarks